(12) United States Patent
Yu et al.

(10) Patent No.: US 11,564,306 B2
(45) Date of Patent: Jan. 24, 2023

(54) VEHICLE LIGHTING CONTROL CIRCUIT BOX

(71) Applicant: JUTE INDUSTRIAL CO., LTD., Taichung (TW)

(72) Inventors: Chia-Chun Yu, Taichung (TW); Che-Hung Lin, Taichung (TW)

(73) Assignee: JUTE INDUSTRIAL CO., LTD., Taichung (TW)

( * ) Notice: Subject to any disclaimer, the term of this patent is extended or adjusted under 35 U.S.C. 154(b) by 373 days.

(21) Appl. No.: 17/003,436

(22) Filed: Aug. 26, 2020

(65) Prior Publication Data

US 2022/0070991 A1  Mar. 3, 2022

(51) Int. Cl.
| | |
|---|---|
| *H05F 3/00* | (2006.01) |
| *F21V 23/00* | (2015.01) |
| *F21V 29/508* | (2015.01) |
| *B60Q 1/00* | (2006.01) |
| *H05K 5/03* | (2006.01) |
| *H05K 7/20* | (2006.01) |
| *B60R 16/03* | (2006.01) |
| *F21V 29/76* | (2015.01) |

(52) U.S. Cl.
CPC ............ *H05F 3/00* (2013.01); *B60Q 1/0088* (2013.01); *B60R 16/03* (2013.01); *F21V 23/007* (2013.01); *F21V 29/508* (2015.01); *F21V 29/76* (2015.01); *H05K 5/03* (2013.01); *H05K 7/20409* (2013.01)

(58) Field of Classification Search
None
See application file for complete search history.

(56) References Cited

U.S. PATENT DOCUMENTS

| | | | | |
|---|---|---|---|---|
| 3,760,486 A | * | 9/1973 | Rifkin ................. | H05K 7/1415 |
| | | | | 206/39 |
| 3,848,953 A | * | 11/1974 | Petroshanoff ........ | H05K 7/1407 |
| | | | | 361/801 |
| 4,301,494 A | * | 11/1981 | Jordan ................ | H05K 7/1409 |
| | | | | 439/157 |
| 4,445,740 A | * | 5/1984 | Wallace .............. | H01R 13/629 |
| | | | | 439/157 |
| 4,446,966 A | * | 5/1984 | Moloney ............. | B65D 5/5028 |
| | | | | 206/499 |
| 4,520,428 A | * | 5/1985 | Lusk ................... | H05K 7/1417 |
| | | | | 361/801 |
| 4,941,835 A | * | 7/1990 | Lasmayoux ......... | H05K 7/1411 |
| | | | | 439/152 |
| 5,325,274 A | * | 6/1994 | Mays .................. | B60R 1/1207 |
| | | | | 362/512 |

(Continued)

*Primary Examiner* — Krystal Robinson
(74) *Attorney, Agent, or Firm* — Muncy, Geissler, Olds & Lowe, P.C.

(57) ABSTRACT

A vehicle lighting control circuit box is provided, including a case member, a circuit unit, at least one cover member and a positioning assembly. The case member is a metal member and extends along a longitudinal direction, the case member defines a receiving space, and two ends of the case member on the longitudinal direction respectively have an opening communicating with the receiving space. The circuit unit is received in the receiving space. Each of the at least one cover member covers one of the two openings. The positioning assembly is disposed on the case member to position the circuit unit within the receiving space to make the circuit unit contact with the case member.

10 Claims, 6 Drawing Sheets

(56) References Cited

U.S. PATENT DOCUMENTS

| | | | | |
|---|---|---|---|---|
| 5,673,181 | A * | 9/1997 | Hsu | H05K 5/0269 |
| | | | | 439/946 |
| 5,859,766 | A * | 1/1999 | Van Scyoc | H05K 5/0052 |
| | | | | 361/752 |
| 11,084,419 | B1 * | 8/2021 | Chen | B60Q 3/68 |
| 2003/0211782 | A1 * | 11/2003 | Esparaz | H01R 13/6658 |
| | | | | 439/620.11 |
| 2016/0380585 | A1 * | 12/2016 | Gingrich, III | H02S 40/34 |
| | | | | 174/520 |

* cited by examiner

VEHICLE LIGHTING CONTROL CIRCUIT BOX

BACKGROUND OF THE INVENTION

Field of the Invention

The present invention relates to a vehicle lighting control circuit box.

Description of the Prior Art

Nowadays, the equipment of a vehicle is more and more complicated, there are various lights in a vehicle, for example, blinkers, headlights, high beams, daytime running lights and other lights. To organize the operation of the lights, the lights are controlled via an electronic control unit, and the electronic control unit is assembled in a control box to protect the electronic control unit from having a liquid being spilled thereon or being hit by an object.

However, a box body of the conventional control box is integrally made of plastic by molding. The plastic material cannot guide and remove a static electricity, so when the electronic control unit produces the static electricity, the static electricity cannot be guided to outside effectively through the plastic shell. If the electronic control unit is easily damaged because of the static electricity, it would cost a car owner a certain amount of money to replace or maintain the electronic control unit.

The present invention has arisen to mitigate and/or obviate the afore-described disadvantages.

SUMMARY OF THE INVENTION

The major object of the present invention is to provide a vehicle lighting control circuit box, which can effectively remove static electricity from an electronic control unit to prolong a service life of the electronic control unit.

To achieve the above and other objects, a vehicle lighting control circuit box is provided, including a case member, a circuit unit, at least one cover member and a positioning assembly. The case member is a metal member and extends along a longitudinal direction, the case member defines a receiving space, and two ends of the case member on the longitudinal direction respectively have an opening communicating with the receiving space. The circuit unit is received in the receiving space. Each of the at least one cover member covers one of the two openings. The positioning assembly is disposed on the case member to position the circuit unit within the receiving space to make the circuit unit contact with the case member.

The present invention will become more obvious from the following description when taken in connection with the accompanying drawings, which show, for purpose of illustrations only, the preferred embodiment(s) in accordance with the present invention.

DETAILED DESCRIPTION OF THE PREFERRED EMBODIMENTS

Figure 1:
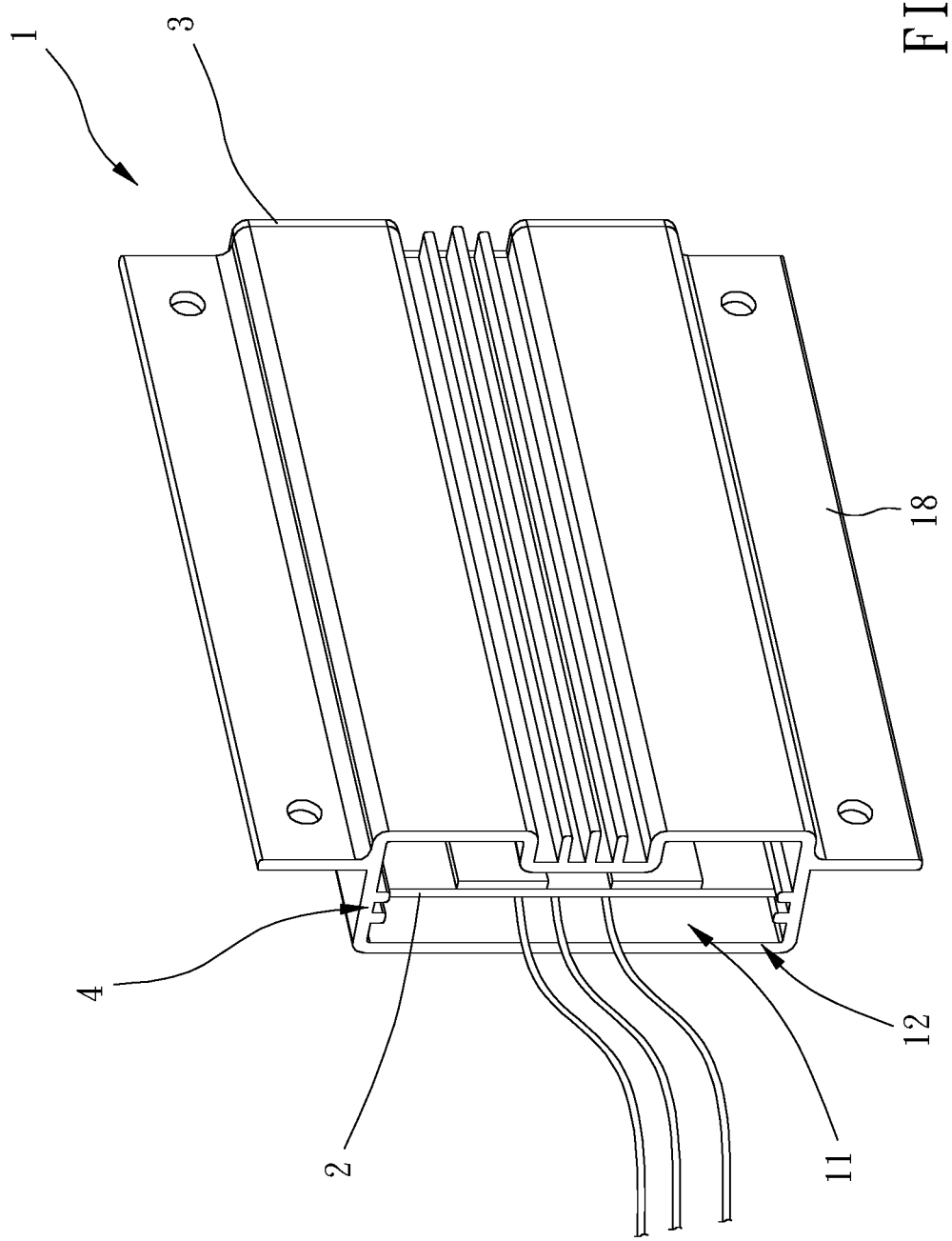
FIG. 1 is a stereogram of a stereogram of a preferred embodiment of the present invention.
Figure 2:
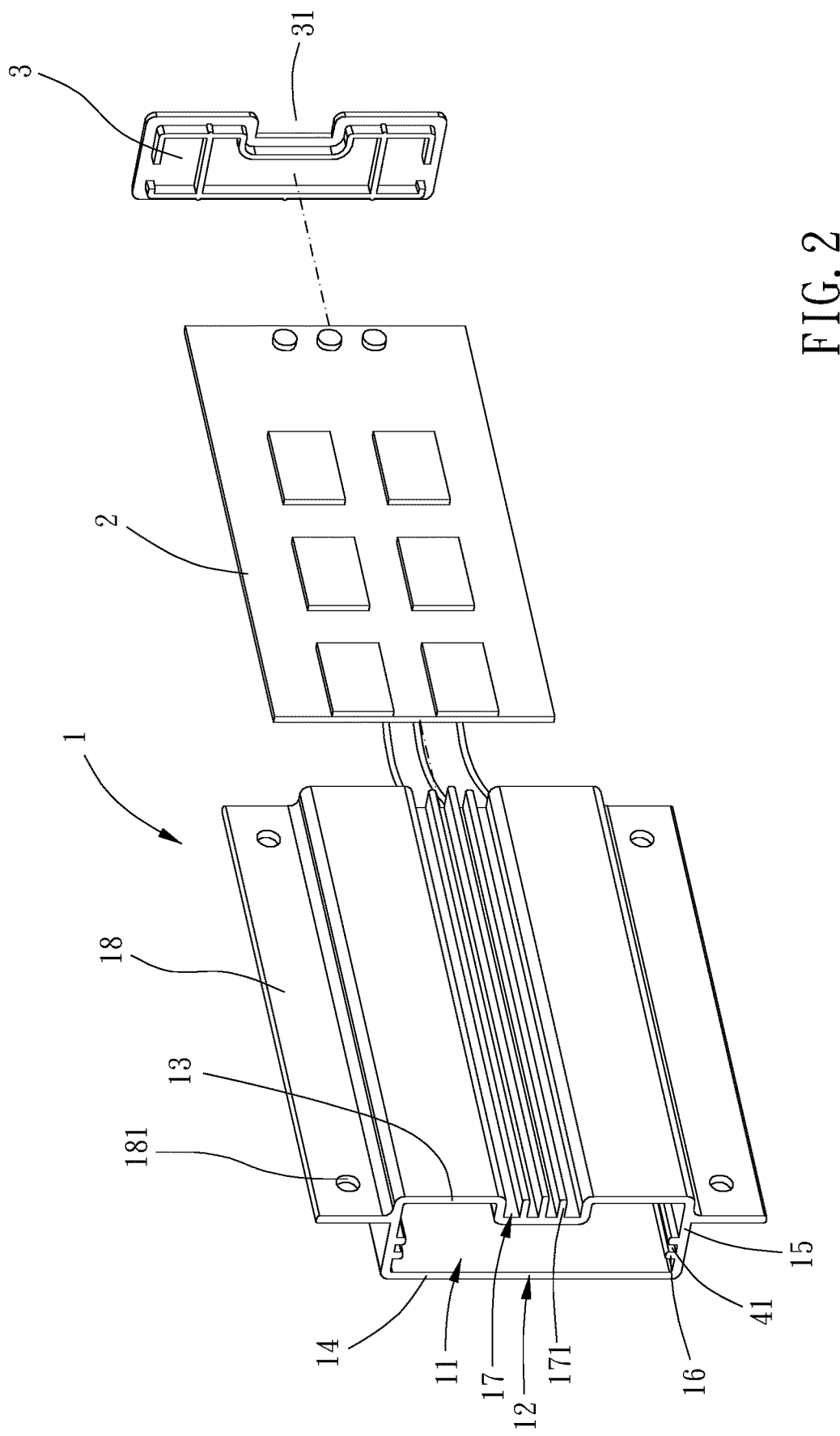
FIG. 2 is a breakdown view of the preferred embodiment of the present invention.
Figure 3:
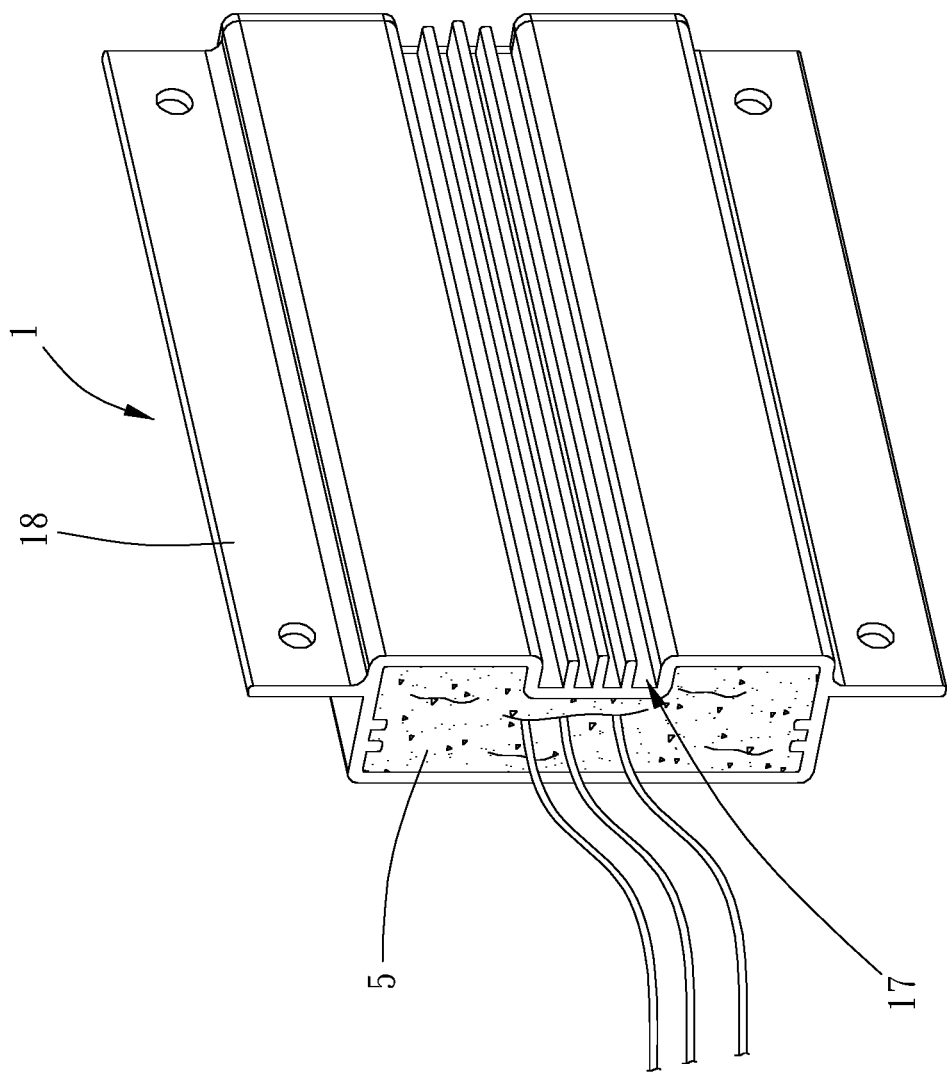
FIG. 3 is a drawing showing an assembly of the preferred embodiment of the present invention.
Figure 4:
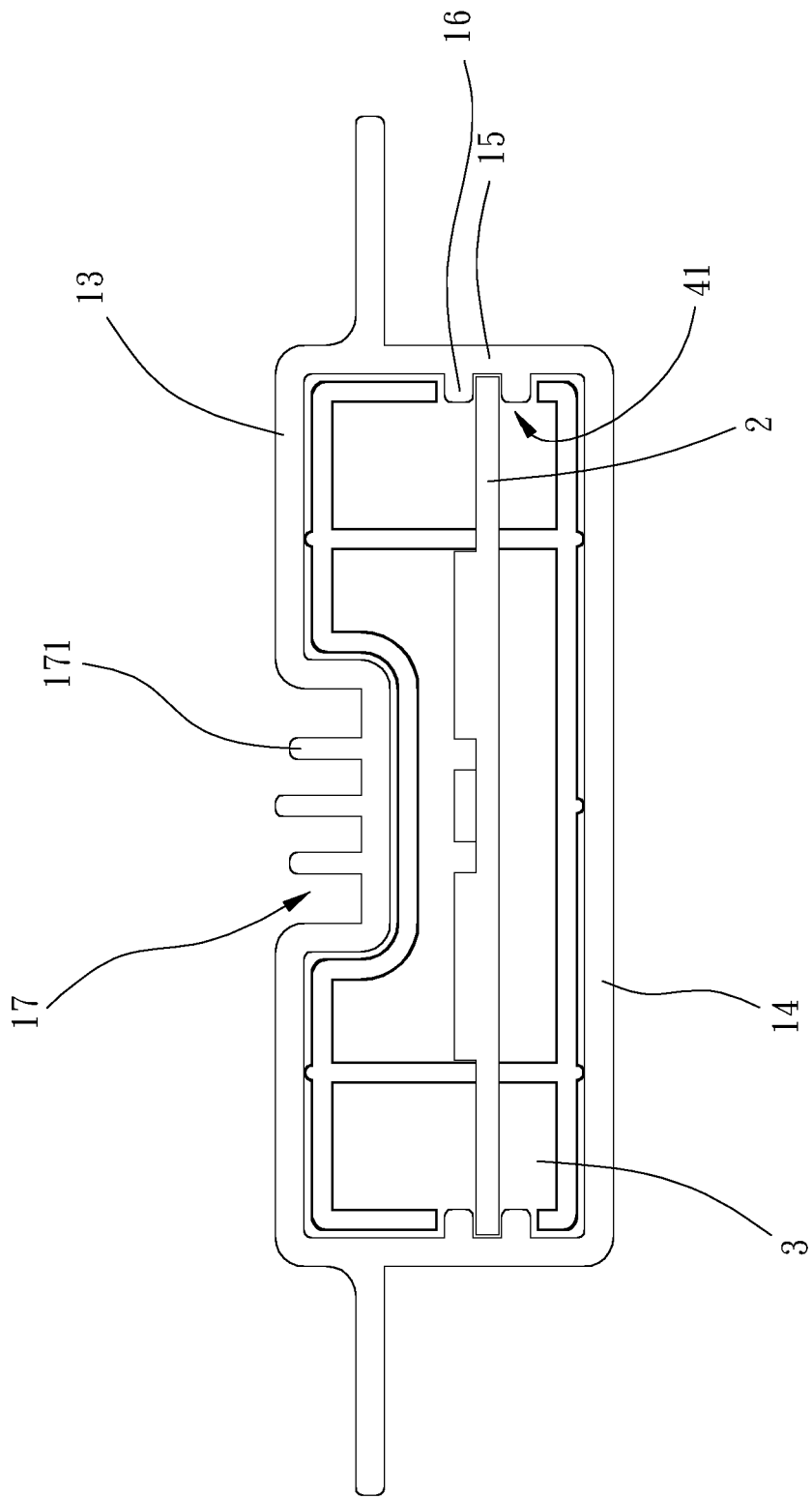
FIG. 4 is a side view of the preferred embodiment of the present invention.

The present invention will be clearer from the following description when viewed together with the accompanying drawings, which show, for purpose of illustrations only, the preferred embodiment in accordance with the present invention.

Please refer to FIGS. 1 to 4 for a preferred embodiment. A vehicle lighting control circuit box includes a case member 1, a circuit unit 2, at least one cover member 3 and a positioning assembly 4.

The case member 1 is a metal member and extends along a longitudinal direction, the case member 1 defines a receiving space 11, and two ends of the case member 1 on the longitudinal direction respectively have an opening 12 communicating with the receiving space 11.

The circuit unit 2 is received in the receiving space 11. In this embodiment, the circuit unit 2 is a circuit board which has a plurality of chips.

Each of the at least one cover member 3 covers one of the two openings 12.

The positioning assembly 4 is disposed on the case member 1 to position the circuit unit 2 within the receiving space 11 to make the circuit unit 2 contact with the case member 1. Thereby, the circuit unit 2 contacts the case member 1 which is a metal member, so when the circuit unit 2 produces a static electricity, the circuit unit 2 can conduct the static electricity to the case member 1 and to outside via the case member 1 to prevent the circuit unit 2 from being easily damaged because of having the static electricity. The vehicle lighting control circuit box can effectively remove the static electricity from the circuit unit 2 to prolong a service life of the circuit unit 2 and increase a heat dissipation efficiency of the case member 1.

It is to be noted that the case member 1 is integrally formed through aluminum extrusion along the longitudinal direction. Specifically, different car models would have different combination of lights, so the circuit unit 2 of different car models are in different dimensions. A case body of a conventional electronic control box is integrally made of plastic by molding, so the case body of the conventional electronic control box of the circuit unit 2 in different sizes needs to be produced with different molds, so a manufacturing cost would be too high. In this embodiment, the case member 1 is integrally formed through aluminum extrusion along the longitudinal direction, a user can cut a length of the case member 1 according to different car models, so it is cost-saving to develop models and manufacture.

Specifically, the case member 1 includes a top panel 13, a bottom panel 14 and two side panels 15, the top panel 13, the bottom panel 14 and the two side panels 15 define the receiving space 11, and the two side panels 15 are integrally connected to and between the top panel 13 and the bottom panel 14.

More specifically, the positioning assembly 4 includes two slide slots 41, the two slide slots 41 are respectively disposed on a side of the two side panels 15 facing the receiving space 11, and two ends of the circuit unit 2 are positioned within the two slide slots 41 to prevent the circuit unit 2 from shaking in the receiving space 11. In this embodiment, two protruding ribs 16 integrally extend from the two side panels 15 toward the receiving space 11, the two protruding ribs 16 of each said side panel 15 define one said slide slot 14 therebetween, and the static electricity on the circuit unit 2 can be effectively removed through connections of the circuit unit 2 with the two protruding ribs 16 of each said side panel 15.

Preferably, at least one of the top panel 13 and the bottom panel 14 has a recess 17 which is dented toward the receiving space 11, the recess 17 extends along the longitudinal direction, a side of each said recess 17 remote from the receiving space 11 has a plurality of heat dissipating fins 171, the plurality of heat dissipating fins 171 extend along the longitudinal direction, and the plurality of heat dissipating fins 171 can effectively increase a heating dissipating area the case member 1 to improve a heat dissipating efficiency. In this embodiment, each of the at least one cover member 3 has a notch 31 on a direction lateral to the longitudinal direction, and the notch 31 corresponds to the recess 17 to smoothly cover the opening 12.

In this embodiment, one said cover member 3 covers one of the two openings 12, the receiving space 11 has a rubber layer 5, and the rubber layer 5 can stably fix the circuit unit 2 in the receiving space 11, so when the case member 1 is collided, the rubber layer 5 can provide a buffering effect to the circuit unit 2. In addition, the rubber layer 5 can prevent the circuit unit 2 from being damped by moisture when the user washes a vehicle or drives the vehicle out on a rainy day, and the rubber layer 5 can conduct heat to transmit a heat produced when the circuit unit 2 generates heat quickly through the rubber layer 5 and the plurality of heat dissipating fins 171 of the recess 17 to outside of the case member 1. In addition, the recess 17 on a surface of the case member 1 is dented toward the receiving space 11, so a volume of the receiving space 11 is decreased, and a rubber material capacity of the rubber layer 5 can also be decreased. Preferably, the recess of the case member could be multiple to help decrease the rubber material capacity of the rubber layer and increase the heat dissipating area and efficiency of the rubber layer.

In this embodiment, the case member 1 extends outwardly to form two wings 18 opposite to each other, the two wings 18 extend along the longitudinal direction, and each said wing 18 has at least one assembling hole 181 for a fastening member to fix the two wings 18 on an interior of a vehicle. Preferably, the two wings 18 are disposed on the two side panels 15 to allow the circuit unit 2 to be placed horizontally.

Figure 5:
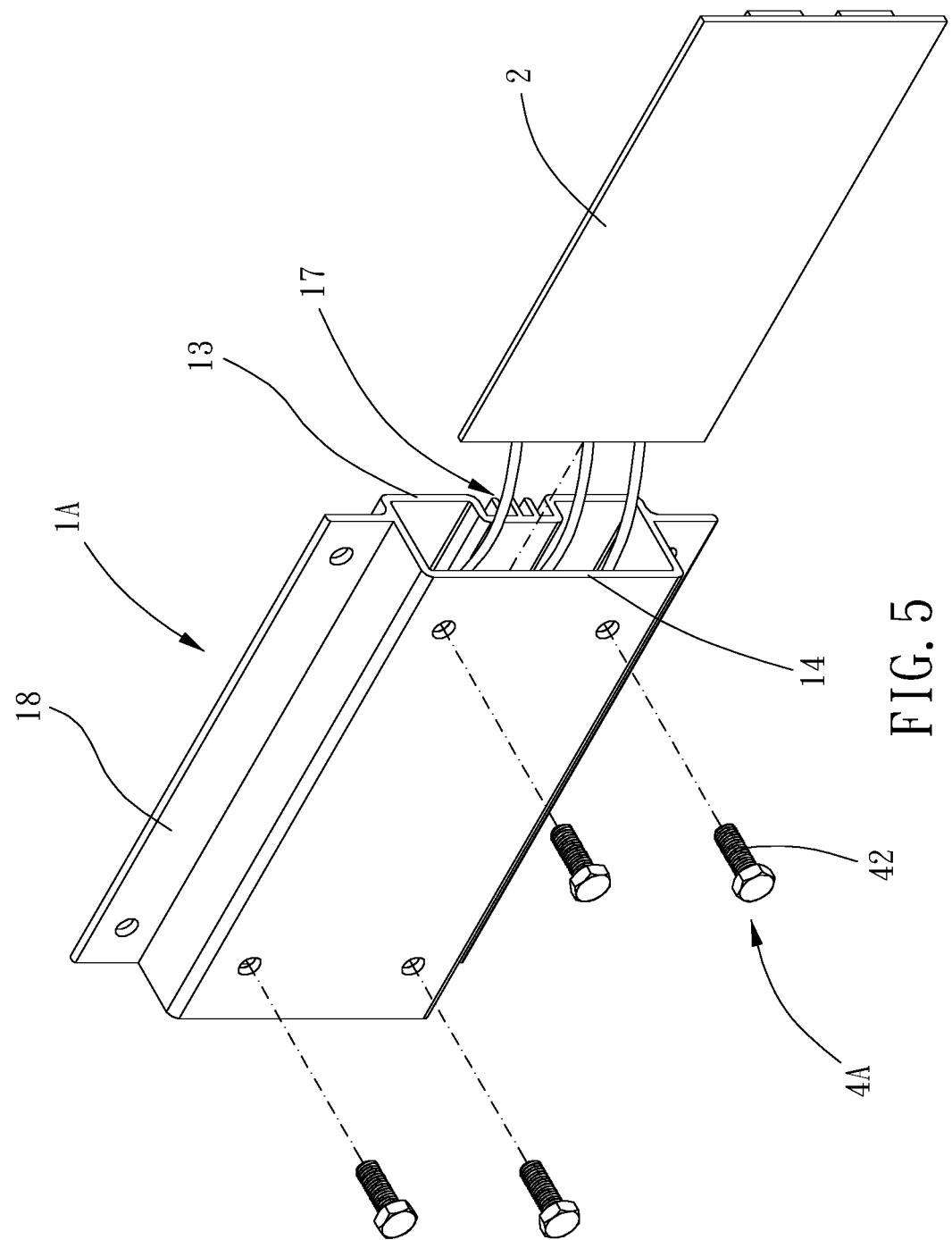
FIG. 5 is a breakdown view of another preferred embodiment of the present invention.
Figure 6:
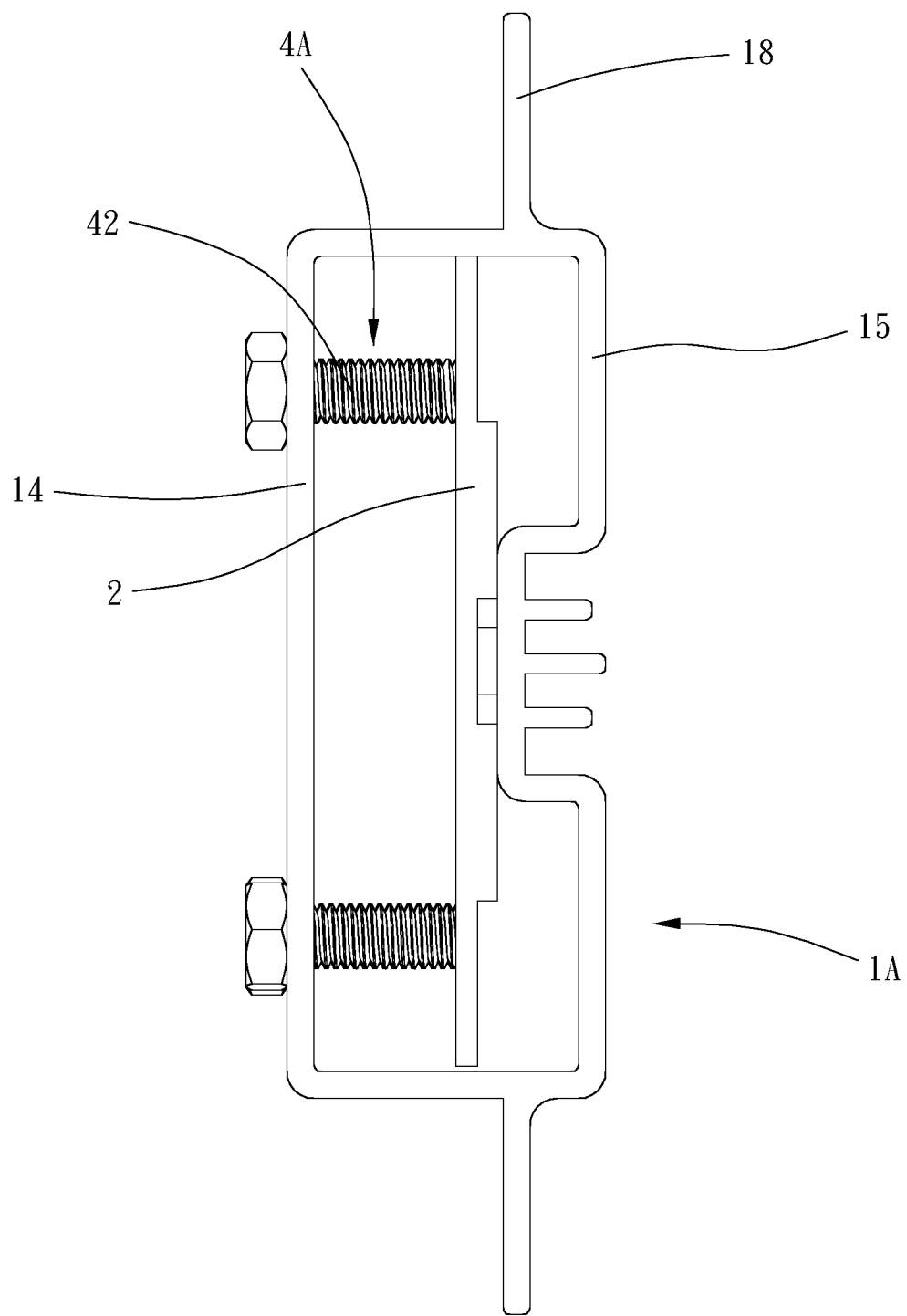
FIG. 6 is a side view of another preferred embodiment of the present invention.

Please further refer to FIGS. 5 and 6 for another embodiment. The positioning assembly 4A includes at least one positioning member 42, the at least one positioning member 42 is disposed through and fixed on one of the top panel 13 and the bottom panel 14 (in this embodiment, the at least one positioning member 42 is fixed on the bottom panel 14) to press the circuit unit 2 to abut against a wall of the recess 17. Specifically, in this embodiment, the positioning assembly 4A includes the plurality of positioning members 42 without the two slide slots. The circuit unit 2 is pressed to abut against the wall of the slide slot 17 via the plurality of positioning members 42 to prevent the circuit unit 2 from moving relative to the case member 1A, so in this embodiment, the static electricity can also be effectively removed, and the heat generated by the circuit unit 2 can be quickly transmitted to the plurality of heat dissipating fins 171 of the recess 17.

Given the above, in the vehicle lighting control circuit box, the circuit unit contacts the case member which is the metal member, so when the circuit unit produces the static electricity, the circuit unit can conduct the static electricity to the case member and to the outside via the case member to prevent the circuit unit from being easily damaged because of having the static electricity. The vehicle lighting control circuit box can effectively remove the static electricity from the circuit unit to prolong the service life of the circuit unit and increase the heat dissipating efficiency the case member.

In addition, the case member is integrally formed through aluminum extrusion along the longitudinal direction, the user can cut a length of the case member according to different car models, so it is cost-saving to develop models and manufacture.

While we have shown and described various embodiments in accordance with the present invention, it should be clear to those skilled in the art that further embodiments may be made without departing from the scope of the present invention.

What is claimed is:

1. A vehicle lighting control circuit box, including:
    a case member, being a metal member and extending along a longitudinal direction, defining a receiving space, two ends of the case member on the longitudinal direction respectively having an opening communicating with the receiving space;
    a circuit unit, received in the receiving space;
    at least one cover member, each of the at least one cover member covering one of the two openings;
    a positioning assembly, disposed on the case member to position the circuit unit within the receiving space to make the circuit unit contact with the case member.

2. The vehicle lighting control circuit box of claim 1, wherein the case member includes a top panel, a bottom panel and two side panels, the top panel, the bottom panel and the two side panels define the receiving space, and the two side panels are integrally connected to and between the top panel and the bottom panel.

3. The vehicle lighting control circuit box of claim 2, wherein the positioning assembly includes two slide slots, the two slide slots are respectively disposed on a side of the two side panels facing the receiving space, and two ends of the circuit unit are positioned within the two slide slots.

4. The vehicle lighting control circuit box of claim 3, wherein two protruding ribs integrally extend from the two side panels toward the receiving space, and the two protruding ribs of each said side panel define one said slide slot therebetween.

5. The vehicle lighting control circuit box of claim 4, wherein at least one of the top panel and the bottom panel has a recess which is dented toward the receiving space, the recess extends along the longitudinal direction, a side of each said recess remote from the receiving space has a plurality of heat dissipating fins, and the plurality of heat dissipating fins extend along the longitudinal direction; the positioning assembly includes at least one positioning member, the at least one positioning member is disposed through and fixed on one of the top panel and the bottom panel to press the circuit unit to abut against a wall of the recess; the receiving space has a rubber layer; the case member extends outwardly to form two wings opposite to each other, the two wings extend along the longitudinal direction, and each said wing has at least one assembling hole; the case member is integrally formed through aluminum extrusion along the longitudinal direction; each of the at least one cover member has a notch on a direction lateral to the longitudinal direction, and the notch corresponds to the recess; the circuit unit is a circuit board; the two wings are disposed on the two side panels.

6. The vehicle lighting control circuit box of claim 2, wherein at least one of the top panel and the bottom panel has a recess which is dented toward the receiving space, the recess extends along the longitudinal direction, a side of each said recess remote from the receiving space has a plurality of heat dissipating fins, and the plurality of heat dissipating fins extend along the longitudinal direction.

7. The vehicle lighting control circuit box of claim 6, wherein the positioning assembly includes at least one positioning member, the at least one positioning member is disposed through and fixed on one of the top panel and the bottom panel to press the circuit unit to abut against a wall of the recess.

8. The vehicle lighting control circuit box of claim 1, wherein the receiving space has a rubber layer.

9. The vehicle lighting control circuit box of claim 1, wherein the case member extends outwardly to form two wings opposite to each other, the two wings extend along the longitudinal direction, and each said wing has at least one assembling hole.

10. The vehicle lighting control circuit box of claim 1, wherein the case member is integrally formed through aluminum extrusion along the longitudinal direction.

* * * * *